(12) United States Patent
Azmat (10) Patent No.: US 10,002,860 B2
(45) Date of Patent: Jun. 19, 2018

(54) INTEGRATED CIRCUIT AND STANDARD CELL LIBRARY

(71) Applicant: SAMSUNG ELECTRONICS CO., LTD., Suwon-si, Gyeonggi-do (KR)

(72) Inventor: Raheel Azmat, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/380,770

(22) Filed: Dec. 15, 2016

(65) Prior Publication Data

US 2017/0352650 A1   Dec. 7, 2017

(30) Foreign Application Priority Data

Jun. 2, 2016 (KR) .................. 10-2016-0068854

(51) Int. Cl.
| | |
|---|---|
| *H01L 23/52* | (2006.01) |
| *H01L 27/02* | (2006.01) |
| *G06F 17/50* | (2006.01) |
| *H01L 23/522* | (2006.01) |
| *H01L 23/528* | (2006.01) |

(52) U.S. Cl.
CPC ...... *H01L 27/0207* (2013.01); *G06F 17/5077* (2013.01); *H01L 23/5226* (2013.01); *H01L 23/5286* (2013.01)

(58) Field of Classification Search
None
See application file for complete search history.

(56) References Cited

U.S. PATENT DOCUMENTS

| | | | | |
|---|---|---|---|---|
| 5,673,196 A | * | 9/1997 | Hoffman | G01R 21/1331 324/141 |
| 6,765,815 B2 | * | 7/2004 | Fujisawa | G11C 5/025 257/E21.656 |
| 7,129,562 B1 | | 10/2006 | Gheewala et al. | |
| 7,240,314 B1 | * | 7/2007 | Leung | G06F 17/5068 257/773 |
| 7,406,367 B2 | * | 7/2008 | Uno | B62J 99/00 180/206.2 |
| 7,989,849 B2 | | 8/2011 | Sherlekar et al. | |
| 8,336,018 B2 | | 12/2012 | Turner et al. | |

(Continued)

FOREIGN PATENT DOCUMENTS

| | | |
|---|---|---|
| JP | 2011258952 | 12/2011 |
| KR | 1020120127252 | 11/2012 |

*Primary Examiner* — David E Graybill
(74) *Attorney, Agent, or Firm* — Volentine, Whitt & Francos, PLLC (57) ABSTRACT

An integrated circuit includes at least one cell. The at least one cell includes a cell region defined by a cell boundary; a power line structure extending in a first direction parallel to and along the cell boundary and including a first power line extending in the first direction along the cell boundary, a plurality of metal islands spaced apart from one another over the first power line in the first direction, and a second power line extending in the first direction over the plurality of metal islands; and a signal line structure disposed in the cell region at the same level as the first power line and the plurality of metal islands. Separation distances between each of the plurality of metal islands and a part of the signal line structure at the same level as the plurality of metal islands are equal to or greater than a critical separation distance.

14 Claims, 10 Drawing Sheets

(56) References Cited

U.S. PATENT DOCUMENTS

| | | |
|---|---|---|
| 8,451,026 B2 | 5/2013 | Biggs et al. |
| 8,513,978 B2 | 8/2013 | Sherlekar |
| 8,914,765 B2 | 12/2014 | Sigal et al. |
| 8,935,641 B2* | 1/2015 | Xu .................. G06F 17/5036 716/104 |
| 9,671,467 B2* | 6/2017 | Kim .................. G05B 15/02 |
| 2004/0066698 A1* | 4/2004 | Fujisawa ............ G11C 5/025 365/232 |
| 2005/0111250 A1* | 5/2005 | Balasuramanian .... G11C 17/12 365/148 |
| 2010/0164077 A1* | 7/2010 | Bando ............. H01L 23/49503 257/659 |
| 2013/0121055 A1* | 5/2013 | Huang .............. G11C 11/413 365/72 |
| 2015/0333008 A1 | 11/2015 | Gupta et al. |

* cited by examiner

INTEGRATED CIRCUIT AND STANDARD CELL LIBRARY

CROSS-REFERENCE TO RELATED APPLICATION

A claim for priority under 35 U.S.C. § 119 is made to Korean Patent Application No. 10-2016-0068854, filed on Jun. 2, 2016, in the Korean Intellectual Property Office, the disclosure of which is incorporated herein in its entirety by reference.

BACKGROUND

The inventive concepts described herein relate to an integrated circuit, and more particularly, to an integrated circuit including at least one standard cell and a standard cell library storing information about the at least one standard cell.

Due to the development of semiconductor process technology, transistor size has been reduced, and thus, a large number of transistors can be integrated into a semiconductor device. For example, a system-on-chip (SOC), that is, an integrated circuit (IC) in which all components of a computer or other electronic systems are integrated into a single chip, is widely used for various applications. As the performance of many applications has improved, a semiconductor device including a larger number of components is required.

SUMMARY

Embodiments of the inventive concept provide an integrated circuit including at least one standard cell having a power line structure with high current density even though the at least one standard cell has small width.

Embodiments of the inventive concept also provide a standard cell library storing information about the at least one standard cell.

Embodiments of the inventive concept provided an integrated circuit including at least one cell. The at least one cell includes a cell region defined by a cell boundary, a power line structure and a signal line structure. The power line structure extends in a first direction parallel to and along the cell boundary. The power line structure includes a first power line extending in the first direction along the cell boundary, a plurality of metal islands spaced apart from one another over the first power line in the first direction, and a second power line extending in the first direction over the plurality of metal islands. The signal line structure is disposed in the cell region at respective same levels as the first power line and the plurality of metal islands. Separation distances between each of the plurality of metal islands and a part of the signal line structure at the same level as the plurality of metal islands are equal to or greater than a critical separation distance.

Embodiments of the inventive concept further provide a standard cell library including information about a plurality of standard cells and being stored in a computer-readable recording medium. At least one of the plurality of standard cells includes a power line structure extending in a first direction parallel to and along a cell boundary, and a signal line structure spaced apart from the power line structure at first and second levels. The power line structure includes a first power line extending in the first direction at the first level, a plurality of metal islands over the first power line and being spaced apart from each other in the first direction at the second level higher than the first level, and a second power line over the plurality of metal islands and extending in the first direction at a third level higher than the second level. Separation distances between each of the plurality of metal islands and a part of the signal line structure closest to each of the plurality of metal islands at the second level, are equal to or greater than a critical separation distance.

Embodiments of the inventive concept still further provide an integrated circuit including a cell region defined by a first cell boundary and a second cell boundary opposite the first cell boundary; a first power line extending in a first direction parallel to and along the first cell boundary; and a second power line extending in the first direction parallel to and along the second cell boundary. Each of the first and second power line structures includes a first power line extending in the first direction along a cell boundary from among the first and second cell boundaries, a plurality of metal islands spaced apart from one another over the first power line in the first direction, and a second power line extending in the first direction over the plurality of metal islands. The integrated circuit further includes a plurality of signal line structures disposed in the cell region at respective same levels as the first power lines of the first and second power line structures and the plurality of metal islands. The respective separation distances between each of the plurality of metal islands and the signal line structures at the same level as the plurality of metal islands are equal to or greater than a critical separation distance.

BRIEF DESCRIPTION OF THE DRAWINGS

Embodiments of the inventive concept will be more clearly understood from the following detailed description taken in conjunction with the accompanying drawings in which.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

An integrated circuit may be defined as a plurality of cells, and may be designed using a cell library including characteristics information of a plurality of cells. In the cell library, names, dimensions, gate widths, pins, delay characteristics, leakage current, threshold voltages, functions or the like of the cells may be defined. A typical cell library set may include basic cells such as AND, OR, NOR, or an inverter, complex cells such as OAI (OR/AND/INVERTER) and AOI (AND/OR/INVERTER), and storage elements such as a simple master-slave flip-flop or a latch.

In embodiments of the inventive concept as will be described, a cell library may be a standard cell library. A standard cell method is a method of designing an exclusive large-scale integrated circuit (LSI) that is adjusted for specifications of a customer or a user by preparing logic circuit blocks (or cells) having various functions set in advance and arbitrarily combining the cells. The cells are designed and verified in advance and then registered to a computer, and logic design, placement, and routing for the combination of cells are performed by using Computer Aided Design (CAD) tools.

In detail, when an LSI is designed or manufactured, if standardized logic circuit blocks (or cells) of a predetermined size are already stored in a library, the logic circuit blocks that are suitable for a current design purpose are arranged in a plurality of cell columns, and wirings may be optimally placed to reduce wire length in the wiring space between the cells, to complete the entire circuit. The larger the number of cell types stored in a library, the more flexible the design of an LSI may be, and a possibility of optimally designed chips is further increased accordingly.

An integrated circuit manufactured using standard cells as described is a type of semi-custom integrated circuit, and is manufactured by using standard cells that are designed in advance and stored in a standard cell library, and by placing the cells while providing shortest wiring between the standard cells. Thus, development costs thereof may be less than a full-custom integrated circuit, and also a period of development may be reduced.

Figure 1:
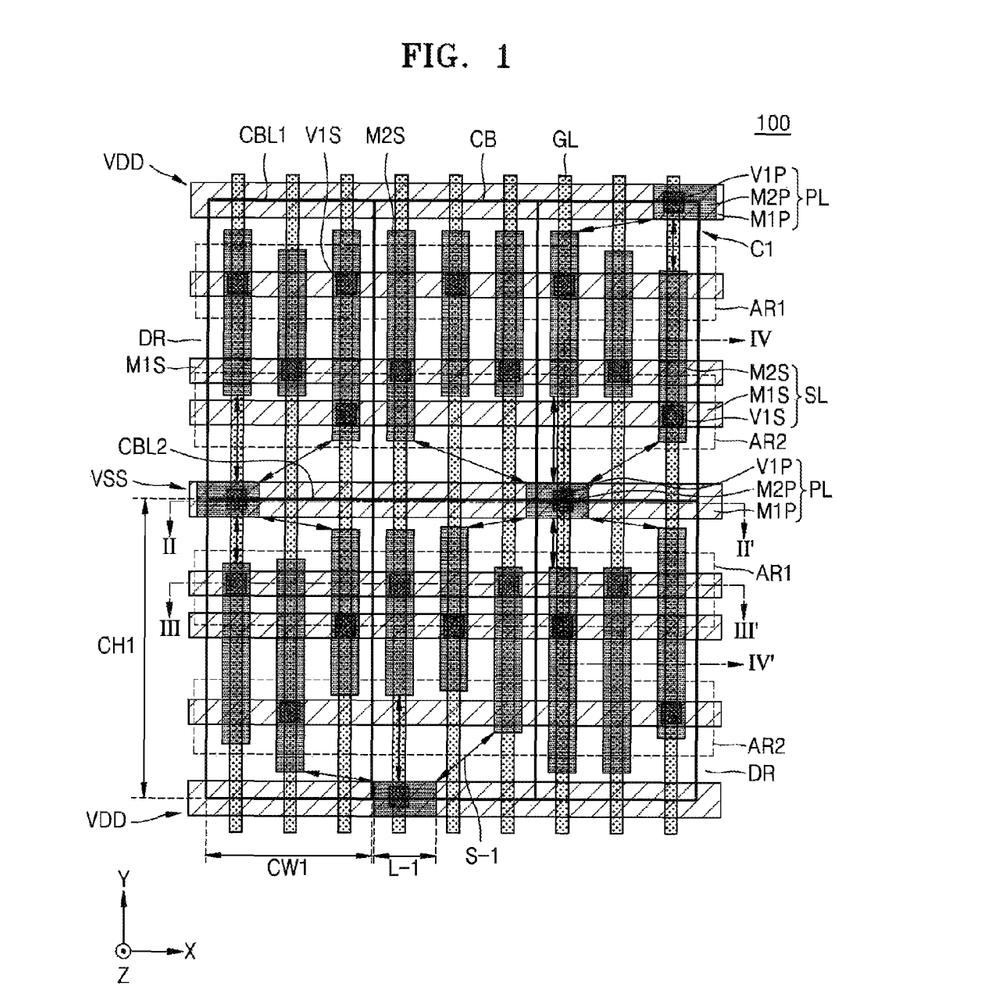
FIG. 1 illustrates a layout of an integrated circuit according to embodiments of the inventive concept.
Figure 2:
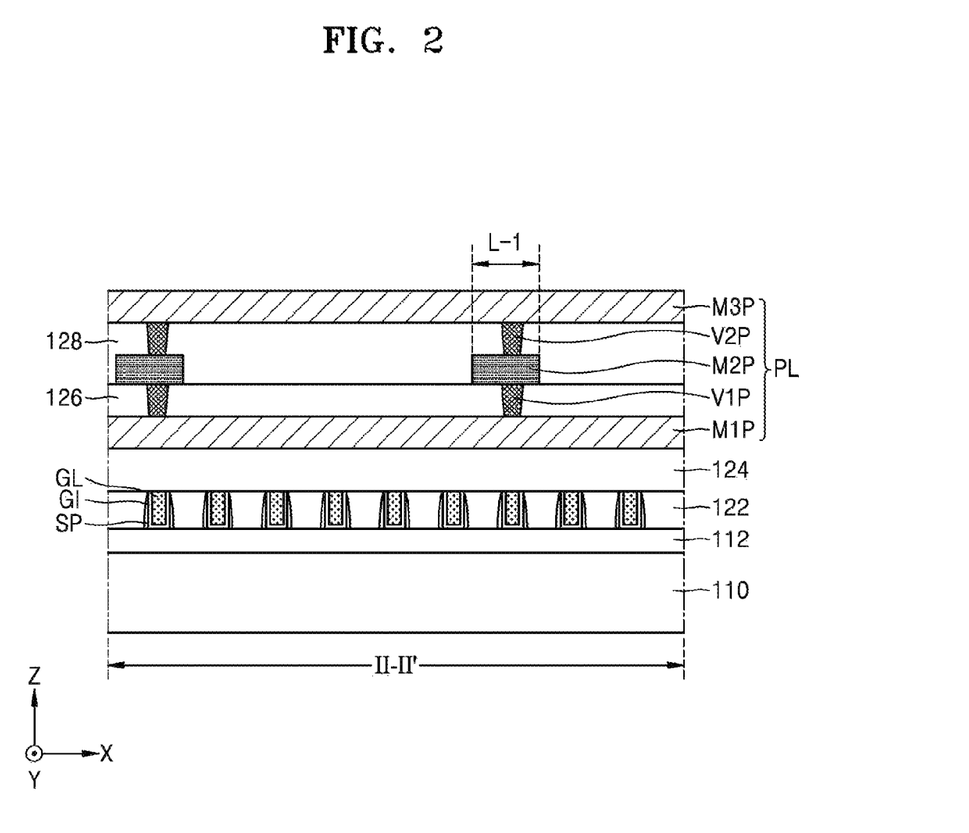
FIG. 2 illustrates a cross-sectional view taken along a line II-II' of FIG. 1.
Figure 3:
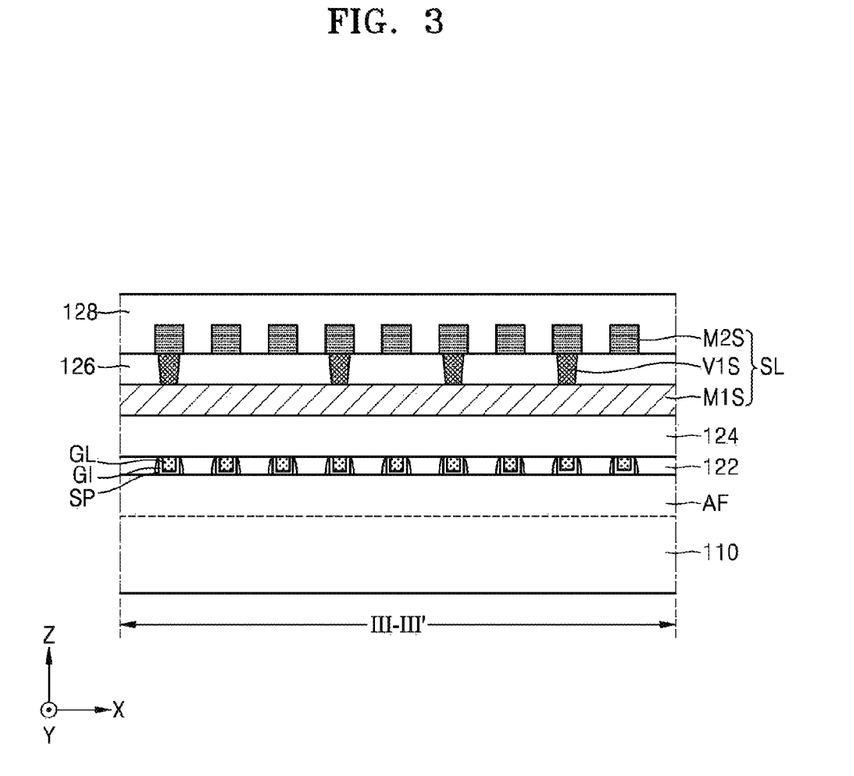
FIG. 3 illustrates a cross-sectional view taken along a line III-III' of FIG. 1.
Figure 4:
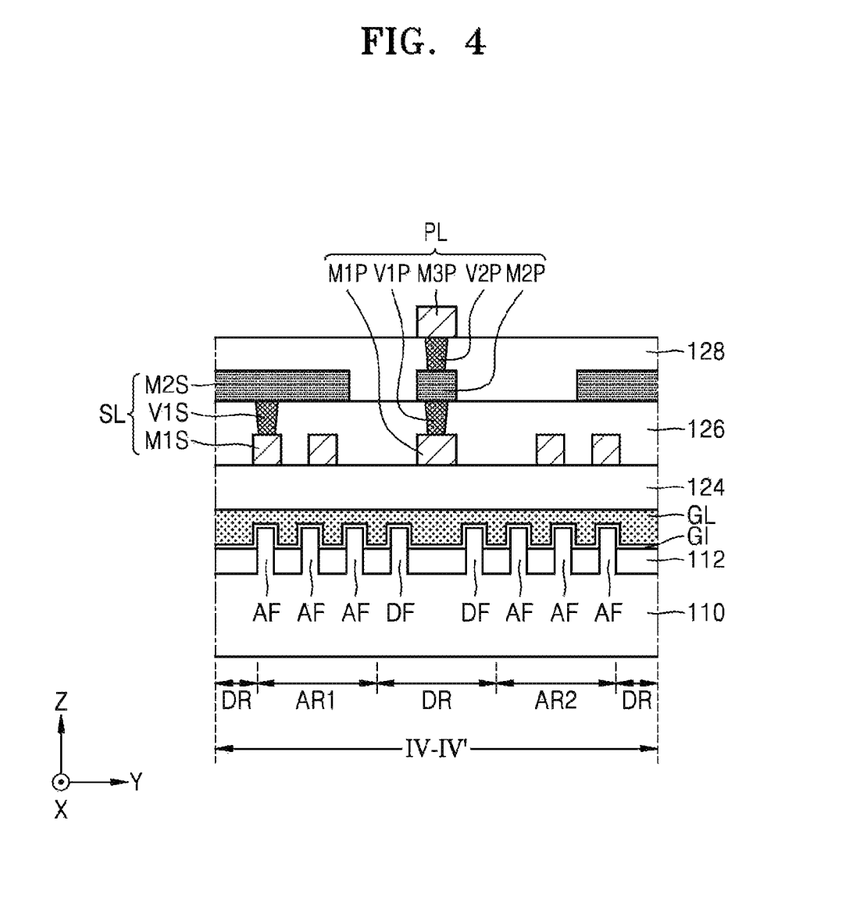
FIG. 4 illustrates a cross-sectional view taken along a line IV-IV' of FIG. 1.

FIG. 1 illustrates a layout of an integrated circuit 100 according to embodiments of the inventive concept. FIG. 2 illustrates a cross-sectional view taken along a line II-II' of FIG. 1. FIG. 3 illustrates a cross-sectional view taken along a line of FIG. 1. FIG. 4 illustrates a cross-sectional view taken along a line IV-IV' of FIG. 1.

Referring to FIGS. 1 to 4, the integrated circuit 100 may include at least one cell C1 defined by a cell boundary CB.

The at least one cell C1 may include an active region (e.g., AR1 and AR2), the active region including a plurality of fins extending in a first direction (e.g., an X direction of FIG. 1) on a substrate 110 and being parallel to one another in a second direction (e.g., a Y direction of FIG. 1) perpendicular to the first direction. The at least one cell C1 may also include a gate line GL extending in the second direction.

The cell boundary CB is an outline that defines the at least one cell C1, and a placement and routing tool may recognize the at least one cell C1 based on the cell boundary CB. The cell boundary CB may have a rectangular shape having a first width CW1 along the first direction (or the X direction) and a first height CH1 along the second direction (or the Y direction). The first height CH1 may be defined to indicate a size of the at least one cell C1 along the second direction. The integrated circuit 100 in FIG. 1 is shown as including six cells C1. However, in other embodiments the integrated circuit 100 may include any number of cells C1.

The cell boundary CB may be defined by four cell boundary lines, and one of the four cell boundary lines, which is parallel to an extension direction of the plurality of fins may be referred to as a first cell boundary line CBL1, and one of the four cell boundary lines, which is opposite the first cell boundary line CBL1 may be referred to as a second cell boundary line CBL2.

The at least one cell C1 may include a first active region AR1 and a second active region AR2 spaced apart from each other via a dummy region DR (see FIG. 4). Furthermore, dummy regions DR may be disposed at both sides of the first and second active regions AR1 and AR2 (see FIG. 4). Therefore, the first and second cell boundary lines CBL1 and CBL2 extending in the first direction may overlap the dummy region DR. The first and second active regions AR1 and AR2 may be N-type impurity-doped regions or P-type impurity-doped regions.

The dummy region DR overlapping the first and second cell boundary lines CBL1 and CBL2 may be a region in which a power line structure PL is formed. For example, a power voltage VDD may be applied to the power line structure PL formed in a region in which the dummy region DR overlaps the first cell boundary line CBL1, and a ground voltage VSS may be applied to the power line structure PL formed in a region in which the dummy region DR overlaps the second cell boundary line CBL2. On the other hand, in other embodiments of the inventive concept, the ground voltage VSS may be applied to the power line structure PL formed in the region in which the dummy region DR overlaps the first cell boundary line CBL1, and the power voltage VDD may be applied to the power line structure PL formed in the region in which the dummy region DR overlaps the second cell boundary line CBL2.

Meanwhile, in a case wherein two of the cells C1 disposed adjacent to each other along the Y direction are arranged to share the first or second cell boundary line CBL1 or CBL2, the power voltage VDD and the ground voltage VSS may be alternately applied to the power line structures PL along the Y direction. In particular, FIG. 1 illustrates three of the cells C1 disposed in a row along the X direction and two of the cells C1 disposed in a row along the Y direction as an example, wherein each cell C1 is arranged to share some part of each cell boundary CB with an adjacent cell C1. Therefore, the power voltage VDD may be commonly applied to the three cells C1 disposed in a row in an upper portion of FIG. 1 by the power line structure PL overlapping the first cell boundary line CBL1, and the ground voltage VSS may be commonly applied to the three cells C1 by the power line structure PL overlapping the second cell boundary line CBL2.

As illustratively shown in FIG. 4, the plurality of fins may extend in the first direction, and may be disposed in parallel to one another in the second direction. Side lower portions of the fins may be covered by an isolation layer 112. From among the fins, a plurality of active fins AF may be disposed in the first and second active regions AR1 and AR2. The plurality of active fins AF may be spaced apart from one another, and inter-fin distances between them may be identical. However, other embodiments of the inventive concept are not limited thereto, and inter-fin distances between the active fins AF may be different from one another.

As illustratively shown in FIG. 4, at least one dummy fin DF may be disposed in the dummy region DR. FIG. 4 illustrates that two dummy fins DF are disposed in the dummy region DR, but the present disclosure is not limited thereto. For example, no dummy fin DF may be formed in the dummy region DR, or one, three, or more dummy fins DF may be formed in the dummy region DR. An inter-fin distance between at least one dummy fin DF and an active fin AF adjacent thereto from among the plurality of active fins AF may be the same as or different from the inter-fin distances between the active fins AF. However, the number, placement, and inter-fin distances of dummy fins DF are not limited to those illustratively shown in FIG. 4. The number and placement of the dummy fins may vary according to required performance or the like such as a function, dimensions, leakage current, a threshold voltage or the like of at least one cell C1.

The at least one cell C1 may include a plurality of gate lines GL that cross the plurality of fins and extend in the second direction and are parallel to each other in the first direction. In some embodiments of the inventive concept, the gate lines GL may include a metal such as for example tungsten (W) or tantalum (Ta), a nitride thereof, a silicide thereof or a doped polysilicon. However, in other embodiments of the inventive concept the gate lines may be other materials.

As illustratively shown in FIG. 2, a gate insulating layer GI may be disposed on or over a side surface and bottom of each of the gate lines GL. A gate spacer SP may be disposed on or over both sidewalls of each gate line GL, with the gate insulating layer GI interposed between the gate line GL and the gate spacer SP. However, unlike FIG. 2, in other embodiments of the inventive concept the gate insulating layer GI may be formed only on or over the bottom of each gate line GL, and the gate spacer SP may be directly formed on both sidewalls of each gate line GL.

An inter-gate insulating layer 122 may be between two gate lines GL adjacent to each other from among the plurality of gate lines GL, and a first insulating interlayer 124 may be disposed on the inter-gate insulating layer 122 and the gate lines GL.

Although not shown in FIG. 2, a first contact may be formed on some part of the gate lines GL vertically overlapping the dummy region DR, and the first contact may penetrate through the first insulating interlayer 124. The first contact may be an input contact providing an electrical connection to the gate lines GL. Furthermore, a second contact (not shown) connected to the active fins AF on both sides of each gate line GL may be formed, and the second contact may penetrate through the first insulating interlayer 124. The second contact may be source and drain contacts providing power connection and ground connection to a transistor element formed in active regions AR1 and AR2. According to some embodiments, the first and second contacts may have layered structures including a barrier layer and a conductive layer for wiring, respectively. The barrier layer may include for example titanium nitride (TiN), tantalum nitride (TaN), or a combination thereof, and the conductive layer for wiring may include for example W, copper (Cu), an alloy thereof, or a combination thereof.

The power line structure PL and a signal line structure SL may be disposed on the first insulating interlayer 124. The power line structure PL and signal line structure SL may be respectively connected to the first and second contacts penetrating through the first insulating interlayer 124, and may further be electrically connected to the gate lines GL and the active fins AF by the first and second contacts, respectively.

The signal line structure SL may include a plurality of first signal lines M1S, a plurality of second signal lines M2S and vias V1S. The first signal lines M1S may extend in the first direction (X direction of FIG. 1) on or over the first insulating interlayer 124 and may be spaced apart from one another in the second direction (Y direction of FIG. 1). In FIG. 1, two first signal lines M1S are shown as spaced apart from each other. The second signal lines M2S may extend in the second direction at a level higher than the first signal lines M1S and may be spaced apart from one another in the first direction. The vias V1S may be between the first signal lines M1S and the second signal lines M2S.

In the signal line structure SL, the first signal lines M1S may extend in the first direction and may have a prescribed pitch with respect to each other, the second signal lines M2S may extend in the second direction perpendicular to the first direction at a prescribed pitch with respect to each other, and the vias V1S may be between the first and second signal lines M1S and M2S. In the embodiment shown in FIG. 2, this structure may be represented by a unidirectional wiring structure. For example, in the unidirectional wiring structure, an extending direction of the first signal lines M1S, which are located at a first level, may be perpendicular to an extending direction of the second signal lines M2S located at a second level that is different from the first level.

In general, as the size of integrated circuits has been reduced over time due to the development of semiconductor process technology, the area of the cells within the integrated circuits has also been reduced. In cells having relatively larger area, signal line structures were disposed with various shapes extending in any directions, so that the signal line structures would have required wiring resistance. However, since the resistance of signal line structures increases as area of the cells and the signal line structures decrease, signals transmitted along such signal line structures of reduced area may consequently be delayed.

In contrast, in accordance with embodiments of the inventive concept as described with respect to FIGS. 1-4, the signal line structure SL has a layered structure including the first signal lines M1S extending in the first direction at the first level and the second signal lines M2S extending in the second direction (perpendicular to the first direction) at the second level. The signal line structure SL may thus have relatively small resistance even in a cell C1 having narrow width and/or small height CH1 and consequently, signal delay of transmitted signals in the integrated circuit may be prevented.

The separation distances along the second direction between end portions of the second signal lines M2S and the first or second cell boundary line CBL1 or CBL2 may be different. For example, as illustratively shown in FIG. 1, a separation distance along the second direction between an end portion of one of the second signal lines M2S and the first cell boundary line CBL1 may be greater than or less than a separation distance along the second direction between an end portion of another one of the second signal lines M2S and the first cell boundary line CBL1. Therefore, a relatively wide space may be partially provided between the first or second cell boundary line CBL1 or CBL2 and the second signal lines M2S.

A location M2P-C (see FIG. 6) of a candidate metal island may be defined in the relatively wide space between the first or second cell boundary line CBL1 or CBL2 and the second signal lines M2S. The location M2P-C of the candidate metal island may be defined as a location at which a separation distance from an end portion of the second signal lines M2S and the first or second cell boundary line CBL1 or CBL2 is greater than a critical separation distance S-DRC (see FIG. 6). The critical separation distance S-DRC may be determined according to a design rule of a photolithography process which is adopted with respect to a process of manufacturing an integrated circuit. For example, the critical separation distance S-DRC, in order to form two patterns spaced apart from each other, may be a minimum distance to be provided between the patterns by considering windows of a process variable. For example, the critical separation distance S-DRC may be related to a resolution of the photolithography process.

A minimum separation distance between the second signal lines M2S and the first or second cell boundary line CBL1 or CBL2 may be less than the critical separation distance S-DRC. For example, the second signal lines M2S may have a relatively wide area to prevent signal delay which mainly occurs in the cell C1 having narrow width and/or small height CH1. In such case, some part of the second signal lines M2S may be at a separation distance, which is less than the critical separation distance S-DRC, from the first or second cell boundary line CBL1 or CBL2. However, another part of the second signal lines M2S may be at a separation distance, which is greater than the critical separation distance S-DRC, from the first or second cell boundary line CBL1 or CBL2, and the location M2P-C of a candidate metal island may thus be defined in the relatively wide space between the another part of the second signal lines M2S and the first or second cell boundary line CBL1 or CBL2.

Meanwhile, the location M2P-C of a candidate metal island will be described again below with reference to FIG. 6.

A second insulating interlayer 126 may be formed on or over the first insulating interlayer 124 to cover upper surfaces and side surfaces of the first signal lines M1S, wherein the second insulating interlayer 126 may surround side surfaces of the vias V1S. For example, in some embodiments of the inventive concept, an upper surface of the second insulating interlayer 126 may be at substantially the same level as upper surfaces of the vias V1S. However, in other embodiments an upper surface of the second insulating interlayer 126 may be at a different level than upper surfaces of the vias V1S. A third insulating interlayer 128 may be formed on or over the second insulating interlayer 126 to cover upper surfaces and side surfaces of the second signal lines M2S thereon.

FIGS. 3 and 4 illustrate an embodiment wherein the signal line structure SL has a structure in which two metal layers, for example the first and second signal lines M1S and M2S, are stacked. However, other embodiments of the inventive concept are not limited thereto, and the signal line structure SL may have a layered structure of three or more metal layers extending in different directions. For example, unlike FIGS. 3 and 4, a plurality of third signal lines (not shown) extending in the first direction may further be formed over the second signal lines M2S. In such a case, a via (not shown) may further be formed between the second signal lines M2S and the third signal lines, and the via may penetrate through the third insulating interlayer 128.

The power line structure PL may include a first power line M1P, a metal island M2P, a second power line M3P, and vias V1P and V2P.

The first power line M1P may extend in the first direction (X direction of FIG. 1) on or over the first insulating interlayer 124 and may be disposed in the dummy region DR overlapping the first and second cell boundary lines CBL1 and CBL2. An upper surface of the first power line M1P may be at substantially the same level as an upper surface of the plurality of first signal lines M1S.

The metal island M2P may extend in the first direction and have a first extension length L-1 at the second level higher than the first power line M1P. An upper surface of the metal island M2P may be at substantially at the same level as an upper surface of the second signal line M2S. The second power line M3P may extend in the first direction at a third level higher than the metal island M2P. The via V1P may be disposed between the first power line M1P and the metal island M2P, and the via V2P may be disposed between the metal island M2P and the second power line M3P.

As illustratively shown in FIG. 1, the metal island M2P may extend in the first direction on the first power line M1P with a relatively small first extension length. For example, as shown in FIG. 1, the metal island M2P may extend with the first extension length L-1 less than the first width CW1 of the cell C1 while the first power line M1P may extend with an extension length greater than the first width CW1 of the cell C1. As a result, a plurality of metal islands M2P may be disposed over the first power line M1P and may be spaced apart from one another having prescribed gaps therebetween.

According to some embodiments of the inventive concept, the first extension length L-1 of each of the metal islands M2P may be substantially the same as one another. For example, the first extension length L-1 of the metal island M2P may be determined based on a resistance of the entire power line structure PL or maximum current density of the power line structure PL. For example, the first extension length L-1 of the metal island M2P may be about 10 nm to 200 nm, but is not limited thereto.

Figure 5:
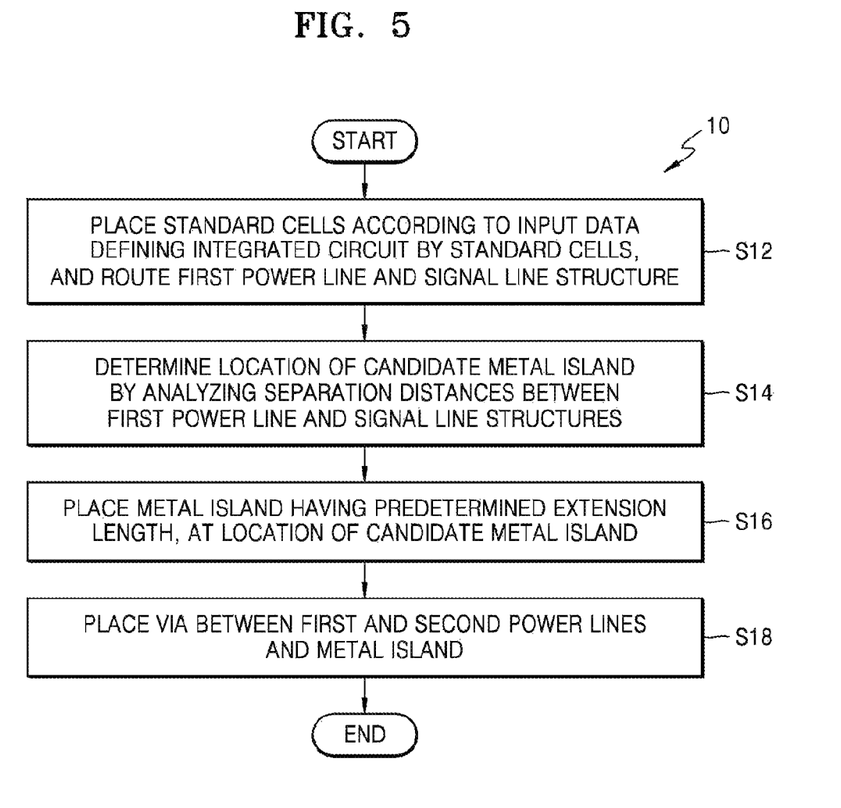
FIG. 5 illustrates a flowchart of a method of designing an integrated circuit according to embodiments of the inventive concept.
Figure 6:
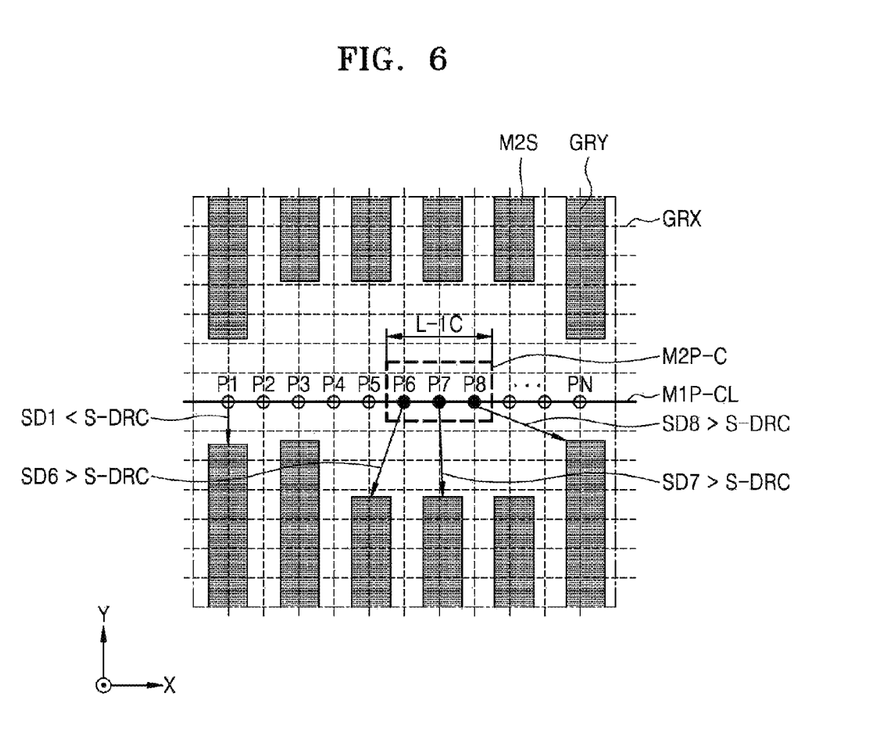
FIG. 6 illustrates a schematic view of a method of determining a location of a candidate metal island.

The metal island M2P may be spaced apart from one of the second signal lines M2S, which is the closest to the metal island M2P, with a separation distance S-1 equal to or greater than the critical separation distance S-DRC (see FIG. 6). For example, according to a method of designing an integrated circuit which will be described below with reference to FIGS. 5 and 6, the metal island M2P may be in the location M2P-C (see FIG. 6) of the candidate metal island spaced apart from the second signal lines M2S with a separation distance equal to or greater than the critical separation distance S-DRC. Therefore, the metal island M2P may extend in a direction different from the extending direction of the second signal lines M2S at the same level as the second signal lines M2S of the signal line structure SL. For example, by maintaining a separation distance S-1 equal to or greater than the critical separation distance S-DRC, a cell C1 having narrow width and/or small height CH1 may include a power line structure PL of a sandwich type.

The power line structure PL of a sandwich type may mean a structure having electrically connecting lines extending along an identical direction at different levels. For example, the first power line M1P may extend in the first direction along the cell boundary CB, the metal island M2P may extend in the first direction at a level higher than the first power line M1P, and the second power line M3P may extend in the first direction at a level higher than the metal island M2P. Accordingly, the power line structure PL including the first power line M1P, the metal island M2P, and the second power line M3P may extend in the first direction.

In general, an integrated circuit cell having narrow width and/or small height CH1 may adopt a unidirectional wiring structure, wherein a metal layer at a first level may be arranged perpendicular to a metal layer at a second level. For example, a signal line structure may have a unidirectional wiring structure, wherein first signal lines at the first level may extend perpendicular to second signal lines at a second level. However, according to embodiments of the inventive concept, the power line structure PL of a sandwich type may include a metal island extending in the first direction to a prescribed length at the same level as the second signal lines M2S extending in the second direction, and thus, the power line structure PL of a sandwich type may be realized even in a unidirectional wiring structure.

Therefore, the first and second power lines M1P and M3P may be electrically connected to each other through the metal island M2P even in a standard cell having a relatively small width (for example, a standard cell having a unidirectional wiring structure), and thus, the power line structure PL of a sandwich type extending in the same direction may be realized. The power line structure PL may have high current density, and thus, may prevent signal delay of the integrated circuit 100.

FIG. 5 illustrates a flowchart of a method 10 of designing an integrated circuit according to embodiments of the inventive concept. FIG. 6 illustrates a schematic view of a method of determining the location M2P-C of the candidate metal island.

Referring to FIGS. 5 and 6, the method 10 of designing the integrated circuit may use a standard cell library. A method of using a standard cell library may be performed by a tool for designing an integrated circuit, and the tool for designing the integrated circuit may be for example a program including a plurality of instruction words performed in a processor, or by a computer or the like. The standard cell library may be stored in a storage medium, and the tool for designing the integrated circuit may use the standard cell library by accessing the storage medium.

In operation S12, standard cells may be placed to configure an integrated circuit according to input data defining the integrated circuit by the standard cells, and a first power line and signal line structure may be routed.

According to some embodiments, the input data may include information about standard cells included in an integrated circuit and a connection relationship of the standard cells, and a layout of the integrated circuit may be completed at a block level by placing the standard cells included in the integrated circuit by using the input data.

According to some embodiments, the input data may include information about a layout of the first power line M1P (see FIG. 1) and a layout of the signal line structure SL (see FIG. 1). For example, as shown in FIG. 1, the first power line M1P may be disposed to extend in the first direction (X direction of FIG. 1) in a region overlapping the first and second cell boundary lines CBL1 and CBL2 (see FIG. 1), and the signal line structure SL may be disposed to include the first signal lines M1S (see FIG. 1) extending in the first direction and the second signal lines M2S extending in the second direction (Y direction of FIG. 1).

The second signal lines M2S may be disposed to have different lengths along the second direction. For example, the separation distances along the second direction between end portions of the second signal lines M2S and the first or second cell boundary line CBL1 or CBL2 may be different.

In operation S14, the location M2P-C of the candidate metal island may be determined by analyzing a separation distance between the first power line M1P and the signal line structures SL.

According to embodiments of the inventive concept, the tool that uses the standard cell library for designing the integrated circuit may determine the location M2P-C of the candidate metal island by analyzing the separation distances between the first power line M1P and the signal line structures SL according to grids defined on the layout of the integrated circuit.

As illustratively shown in FIG. 6, a center line M1P-CL of the first power line M1P may be illustrated and a plurality of analysis points P1, P2, P3, P4, P5, P6, P7, P8, ... PN (which may hereinafter be referred to as analysis points P1, P2, ..., and PN) of the center line M1P-CL of the first power line may be defined by the grids GRX and GRY defined in X and Y directions. A shortest separation distance between each of the analysis points P1, P2, ..., and PN and each of the second signal lines M2S is analyzed, and the shortest separation distance may be selected, and it may be verified whether the shortest separation distance is greater than the critical separation distance S-DRC which may be input in advance. As described above, the critical separation distance S-DRC may be determined by the design rule of the photolithography process which is adopted with respect to the process of manufacturing the integrated circuit.

For example, a first separation distance SD1 between the center line M1P-CL of the first power line and the second signal line M2S that is a shortest separation distance, may be obtained for the first analysis point P1. It may be verified whether the first separation distance SD1 is greater than the critical separation distance S-DRC. When the first separation distance SD1 is less than the critical separation distance S-DRC, the operation of analyzing the separation distance for the second analysis point P2 may follow. As illustrated in FIG. 6, a sixth separation distance SD6 may be greater than the critical separation distance S-DRC for the sixth analysis point P6. Here, the sixth analysis point P6 may be determined as a component location of the location M2P-C of the candidate metal island. Next, seventh and eighth separation distances SD7 and SD8 may be greater than the critical separation distance S-DRC for the seventh and eighth analysis points P7 and P8, and thus, the seventh and eighth analysis points P7 and P8 may also be determined as component locations of the location M2P-C of the candidate metal island.

The continuously arranged analysis points P6, P7, and P8, which are determined as the component locations of the location M2P-C of the candidate metal island, may be defined as the location M2P-C of the candidate metal island. For example, the location M2P-C of the candidate metal island may have a first length L-1C along the first direction (X direction), and the first length L-1C may have a value determined in advance according to the design rule of the photolithography process or more.

In operation S16, the metal island M2P having the first extension length L-1 determined in advance may be placed in the location M2P-C of the candidate metal island.

For example, the first extension length L-1 determined in advance of the metal island M2P may be less than the first length L-1C of the location M2P-C of the candidate metal island. The first extension length L-1 of the metal island M2P may be about 10 nm to 200 nm, but is not limited thereto.

According to some embodiments of the inventive concept, the metal island M2P may be disposed in any location in the location M2P-C of the candidate metal island. For example, the first extension length L-1 of the metal island M2P may be less than the first length L-1C of the location M2P-C of the candidate metal island, and the metal island M2P may be disposed in a center of the location M2P-C of the candidate metal island, or may be disposed at a side of the center of the location M2P-C. As the location M2P-C of the candidate metal island is defined as a location at which separation distances from the second signal lines M2S are equal to or greater than the critical separation distance S-DRC, separation distances between the metal island M2P and the second signal lines M2S may also be equal to or greater than the critical separation distance S-DRC.

According to other embodiments of the inventive concept, when the first length L-1C of the location M2P-C of the candidate metal island is greater than twice the first extension length L-1 of the metal island M2P, two metal islands M2P may be disposed in the location M2P-C of the candidate metal island. However, the inventive concept is not limited thereto.

In operation S18, the via V1P may be placed between the first power line M1P and the metal island M2P to electrically connect the first power line M1P and the metal island M2P. Next, the second power line M3P may be disposed on or over the third insulating interlayer 128 and the via V2P may be placed to electrically connect the metal island M2P and the second power line M3P.

The integrated circuit 100 may be designed by performing the operations described above.

In general, it may be more advantageous for a cell having a small width to have a unidirectional wiring structure in which a metal layer at a first level is disposed perpendicular to a metal layer at a second level. However, since a separation distance between a power line structure and a signal line structure is relatively smaller in the unidirectional wiring structure, it is difficult to form a power line structure of a sandwich type. Therefore, in order to form the power line structure of a sandwich type, the cell may be designed to have a relatively wide separation distance between the power line structure and the signal line structure. However, it is difficult to downscale the integrated circuit 100 as the cell height CH1 (see FIG. 1) increases.

However, according to the embodiments of the inventive concept described above, the location M2P-C of the candidate metal island may be obtained by disposing the standard cells and the signal line structure SL, and analyzing separation distances therebetween. As the metal island M2P is disposed in the location M2P-C of the candidate metal island, the power line structure PL of a sandwich type may be realized even if the cell height CH1 does not increase.

Figure 7:
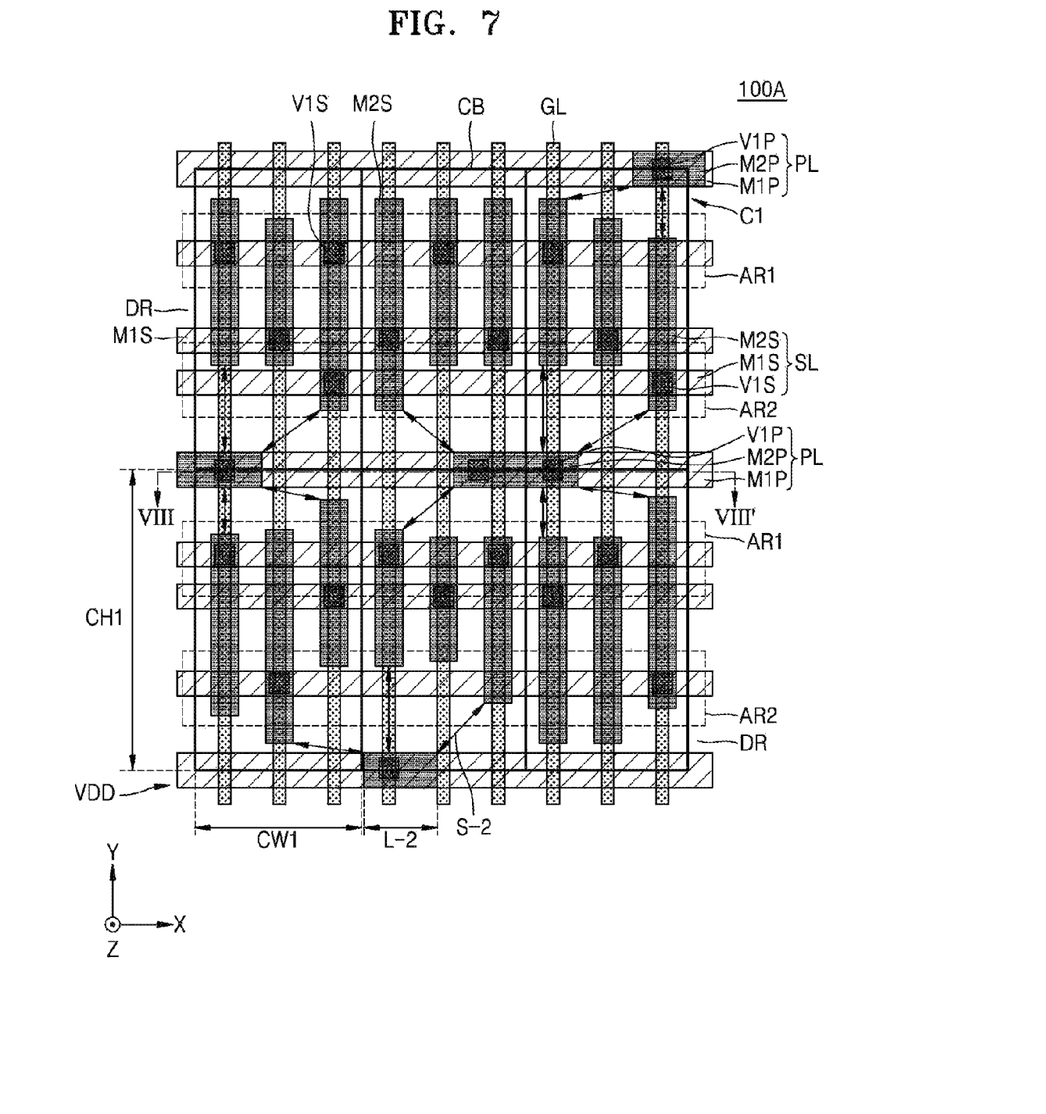
FIG. 7 illustrates a layout of an integrated circuit according to embodiments of the inventive concept.
Figure 8:
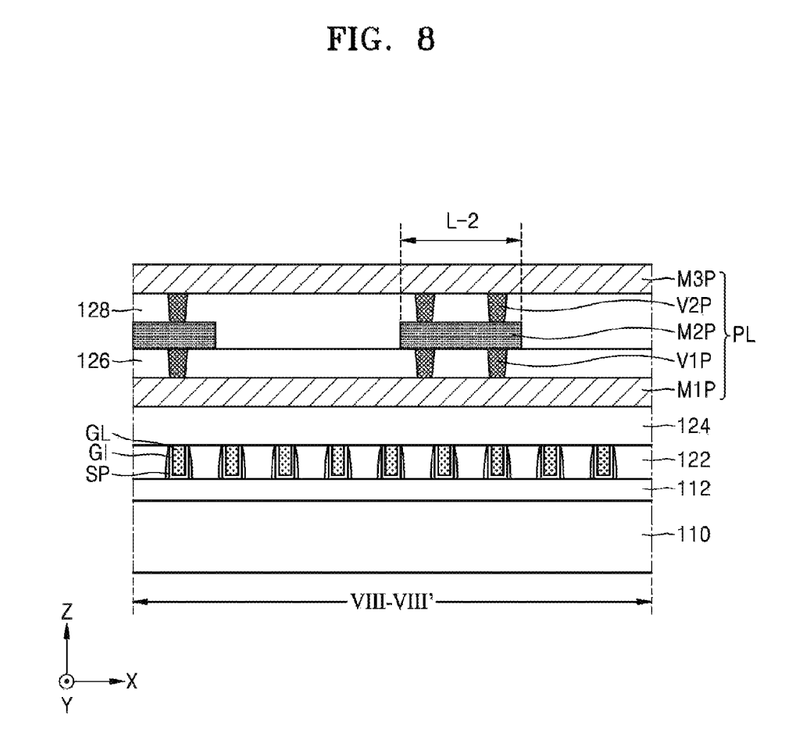
FIG. 8 illustrates a cross-sectional view taken along a line VIII-VIII' of FIG. 7.
Figure 9:
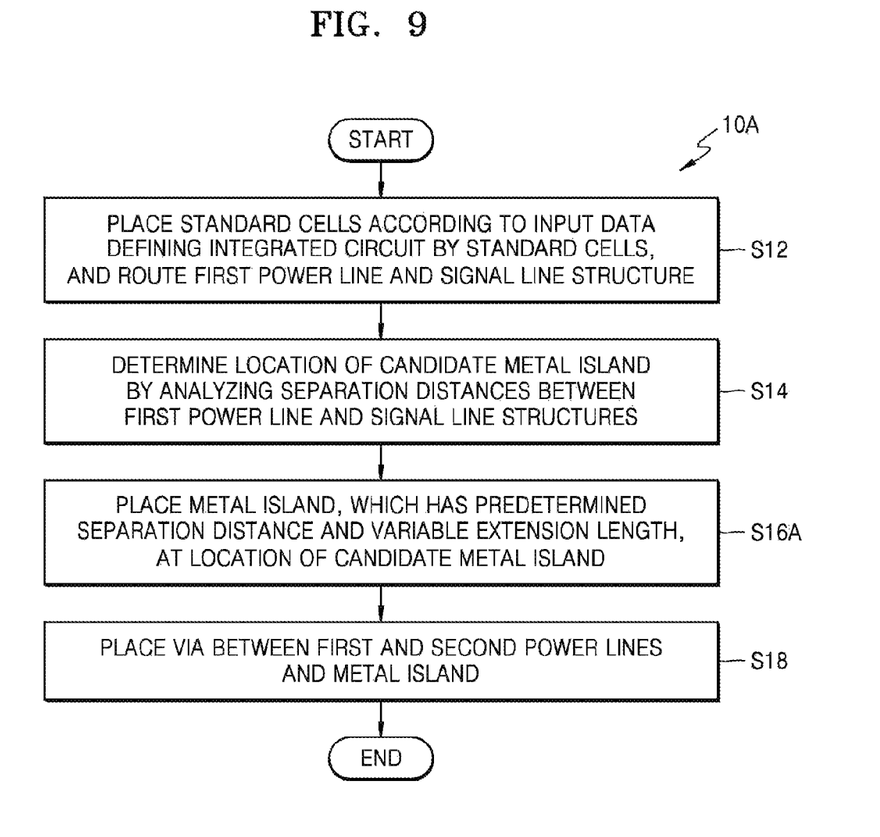
FIG. 9 illustrates a flowchart of a method of designing an integrated circuit according to embodiments of the inventive concept.

FIG. 7 illustrates a layout of an integrated circuit 100A according to embodiments of the inventive concept. FIG. 8 illustrates a cross-sectional view taken along a line VIII-VIII' of FIG. 7. FIG. 9 illustrates a flowchart of a method 10A of designing an integrated circuit according to embodiments of the inventive concept.

FIG. 9 describes the method 10A of designing the integrated circuit 100A with reference to FIGS. 7 and 8. In FIGS. 7 to 9, like reference numerals in FIGS. 1 to 6 denote like elements, and therefore, detailed descriptions of such like elements will not be given. The following will focus on the differences between the embodiments described with respect to FIGS. 1 to 6 and the embodiments of FIGS. 7 to 9.

Referring to FIGS. 7 to 9, a plurality of metal islands M2P may have a variable extension length L-2. For example, in operation S16A of FIG. 9, a metal island M2P, which has a separation distance S-2 determined in advance and variable extension length L-2, may be located in the location M2P-C (see FIG. 6) of the candidate metal island. For example, the variable extension length L-2 of the metal island M2P may be the same as the first length L-1C (see FIG. 6) of the location M2P-C of the candidate metal island. For example, the variable extension length L-2 of the metal island M2P may be less than the first length L-1C (see FIG. 6) of the location M2P-C of the candidate metal island.

For example, a separation distance S-2 between one of the metal islands M2P and a second signal line M2S closest to the one of the metal islands M2P from among the second signal lines M2S, may be the same as a separation distance S-2 between the other one of the metal islands M2P and a second signal line M2S closest to the other one of the metal islands M2P from among the second signal lines M2S. Therefore, a variable extension length L-2 of the one of the metal islands M2P in the first direction (X direction) may be different from a variable extension length L-2 of the other one of the metal islands M2P in the first direction (X direction). That is, the metal islands M2P of the integrated circuit 100A may have different respective lengths in the first direction.

As illustratively shown in FIG. 8, each of the metal islands M2P may be electrically connected to the first power line M1P by at least one via V1P, and may further be electrically connected to the second power line M3P by at least one via V2P. For example, when the metal islands M2P are respectively connected to the first and second power lines M1P and M3P by two vias V1P and two vias V2P such as shown in FIG. 8, the power line structure PL may have improved current density.

Figure 10:
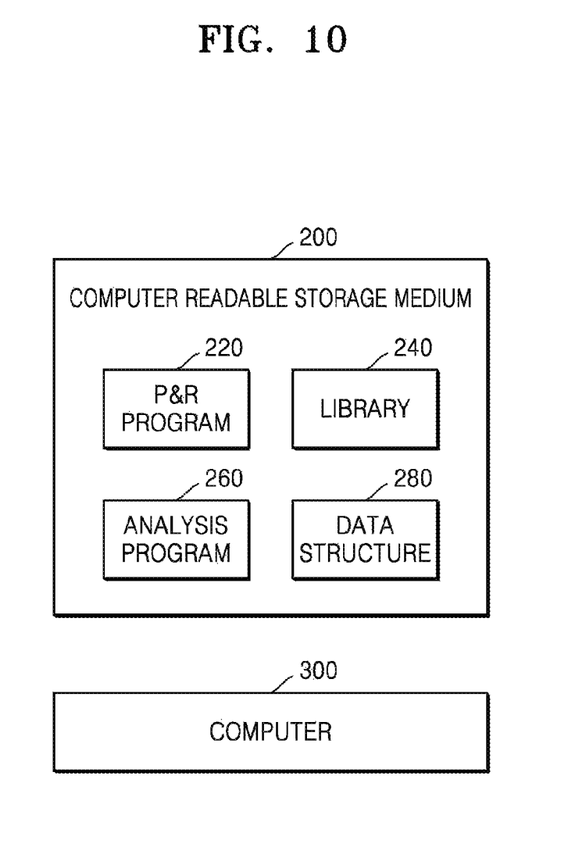
FIG. 10 illustrates a block diagram of a storage medium including a standard cell library as usable with a computer, according to embodiments of the inventive concept.

FIG. 10 illustrates a block diagram of a storage medium 200 as usable with a computer 300, according to embodiments of the inventive concept.

Referring to FIG. 10, the storage medium 200, which is a computer-readable recording medium, may include any computer-readable recording medium, or a non-transitory computer-readable recording medium, which can provide a computer 300 or the like with instruction words and/or data. The computer-readable recording medium may for example be inserted or integrated in the computer 300, or may be coupled to the computer 300 through a communication medium such as a network and/or a wireless link.

As illustrated in FIG. 10, the computer-readable recording medium 200 may include a placing and wiring program 220, a library 240, an analysis program 260, and a data structure 280. The placing and wiring program 220 may include a plurality of instruction words to perform the method of designing the integrated circuit by using the standard cell library according to embodiments of the inventive concept. For example, the computer-readable recording medium 200 may store the placing and wiring program 220 including any instruction words for designing an integrated circuit based on the standard cell library including at least one cell C1 described with reference to FIGS. 1 to 9. The library 240 may include information about standard cells which are units which may configure the integrated circuit. The library 240 may include information about at least one cell C1 described with reference to FIGS. 1 to 9. The analysis program 260 may include a plurality of instruction words performing a method of analyzing an integrated circuit based on data defining the integrated circuit. The data structure 280 may include a storage space to manage data generated during a process of using the standard cell library included in the library 240, extracting marker information from the general standard cell library included in the library 240, or analyzing characteristics of an integrated circuit by the analysis program 260.

While the inventive concept has been particularly shown and described with reference to embodiments thereof, it should be understood that various changes in form and details may be made therein without departing from the spirit and scope of the following claims.

What is claimed is:

1. An integrated circuit comprising at least one cell, wherein the at least one cell comprises:
   a cell region defined by a cell boundary;
   a power line structure connectable to a power voltage and extending in a first direction parallel to and along the cell boundary, the power line structure comprising
      a first power line extending in the first direction along the cell boundary,
      a plurality of metal islands spaced apart from one another over the first power line in the first direction, and
      a second power line extending in the first direction over the plurality of metal islands; and
   a signal line structure connectable to a signal and disposed in the cell region at respective same levels as the first power line and the plurality of metal islands,
   wherein the signal line structure comprises
      a plurality of first signal lines extending in the first direction and at the same level as the first power line, and
      a plurality of second signal lines over the plurality of first signal lines, the plurality of second signal lines extending in a second direction perpendicular to the first direction and at the same level as the plurality of metal islands,
      wherein separation distances between the cell boundary and end portions of at least some of the second signal lines are different.

2. The integrated circuit of claim 1, wherein a first separation distance between one of the plurality of metal islands and a second signal line from among the plurality of second signal lines closest to the one of the plurality of metal islands is different from a second separation distance between another one of the plurality of metal islands and another second signal line from among the plurality of second signal lines closest to the another one of the plurality of metal islands, and
   an extension length of the one of the plurality of metal islands along the first direction is equal to an extension length of the another one of the plurality of metal islands along the first direction.

3. The integrated circuit of claim 1, wherein a first separation distance between one of the plurality of metal islands and a second signal line from among the plurality of second signal lines closest to the one of the plurality of metal islands is equal to a second separation distance between another one of the plurality of metal islands and another second signal line from among the plurality of second signal lines closest to the another one of the plurality of metal islands, and
   an extension length of the one of the plurality of metal islands along the first direction is different from an extension length of the another one of the plurality of metal islands along the first direction.

4. The integrated circuit of claim 1, wherein the power line structure further comprises:
   at least one of a plurality of first vias respectively between the first power line and the plurality of metal islands; and
   at least one of a plurality of second vias respectively between the second power line and the plurality of metal islands.

5. The integrated circuit of claim 4, wherein the at least one of a plurality of first vias includes two first vias on each of the plurality of metal islands, and the two first vias are spaced apart from each other along the first direction.

6. The integrated circuit of claim 1, wherein the cell region has a first width along the first direction, and an extension length of at least one of the plurality of metal islands along the first direction is less than the first width.

7. The integrated circuit of claim 1, wherein an extension length of at least one of the plurality of metal islands along the first direction is less than an extension length of the first power line along the first direction.

8. A standard cell library comprising information about a plurality of standard cells, the standard cell library stored in a non-transitory computer-readable recording medium, wherein at least one of the plurality of standard cells comprises:
   a power line structure connected to a power line voltage and extending in a first direction parallel to and along a cell boundary, the power line structure comprising
      a first power line extending in the first direction at a first level,
      a plurality of metal islands over the first power line, the plurality of metal islands spaced apart from each other in the first direction at a second level higher than the first level, and
      a second power line over the plurality of metal islands and extending in the first direction at a third level higher than the second level; and
   a signal line structure connected to a signal and spaced apart from the power line structure at the first and second levels,
   wherein the signal line structure comprises
      a plurality of first signal lines extending in the first direction at the first level, and
      a plurality of second signal lines extending in a second direction at the second level, the second direction perpendicular to the first direction,
      wherein end portions of at least some of the plurality of second signal lines are separated along the second direction from the cell boundary by a first separation distance, and an end portion of another of the plurality of second signal lines is separated along the second direction from the cell boundary by a second separation distance, the second separation distance different from the first separation distance.

9. The standard cell library of claim 8, wherein each of the plurality of metal islands is disposed at locations of respective candidate metal islands, and
   the locations of the respective candidate metal islands are defined as locations at separation distances from end portions of respective second signal lines from among the plurality of second signal lines, the respective second signal lines are closer to the respective candidate metal islands than any other of the plurality of second signal lines.

10. The standard cell library of claim 8, wherein a third separation distance exists between one of the plurality of metal islands and a first corresponding second signal line from among the plurality of second signal lines, the first corresponding second signal line is closer to the one of the plurality of metal islands than any other of the plurality of second signal lines,
- wherein a fourth separation distance exists between another one of the plurality of metal islands and another corresponding second signal line from among the plurality of second signal lines, the another corresponding second signal line is closer to the another one of the plurality of metal islands than any other of the plurality of second signal lines,
- wherein the third separation distance and the fourth separation distance are different, and
- wherein an extension length of the one of the plurality of metal islands along the first direction is equal to an extension length of the another one of the plurality of metal islands along the first direction.

11. The standard cell library of claim 8, wherein a third separation distance exists between one of the plurality of metal islands and a first corresponding second signal line from among the plurality of second signal lines, the first corresponding second signal line is closer to the one of the plurality of metal islands than any other of the plurality of second signal lines,
- wherein a fourth separation distance exists between another one of the plurality of metal islands and another corresponding second signal line from among the plurality of second signal lines, the another corresponding second signal line is closer to the another one of the plurality of metal islands than any other of the plurality of second signal lines,
- wherein the third separation distance and the fourth separation distance are equal, and
- wherein an extension length of the one of the plurality of metal islands along the first direction is different from an extension length of the another one of the plurality of metal islands along the first direction.

12. An integrated circuit comprising at least one cell, wherein the at least one cell comprises:
- a cell region defined by a first cell boundary and a second cell boundary opposite the first cell boundary;
- a first power line structure connectable to a power line voltage and extending in a first direction parallel to and along the first cell boundary;
- a second power line structure connectable to a ground voltage and extending in the first direction parallel to and along the second cell boundary,
- wherein each of the first and second power line structures comprises
  - a first power line extending in the first direction along a cell boundary from among the first and second cell boundaries,
  - a plurality of metal islands spaced apart from one another over the first power line in the first direction, and
  - a second power line extending in the first direction over the plurality of metal islands; and
- a plurality of signal line structures connectable to signals and disposed in the cell region at respective same levels as the first power line of the first and second power line structures and the plurality of metal islands,
- wherein each of the signal line structures comprise
  - a plurality of first signal lines extending in the first direction and at the same level as the first power line, and
  - a plurality of second signal lines over the plurality of first signal lines, the plurality of second signal lines extending in a second direction perpendicular to the first direction and at the same level as the plurality of metal islands,
  - wherein separation distances between the first and second cell boundaries and end portions of at least some of the second signal lines are different.

13. The integrated circuit of claim 12, wherein each of the first and second power line structures further comprise:
- at least one first via electrically connecting each of the plurality of metal islands to the first power line; and
- at least one second via electrically connecting each of the plurality of metal islands to the second power line.

14. The integrated circuit of claim 12, wherein the plurality of metal islands each extend in the first direction.

* * * * *